United States Patent
Choi et al.

[11] Patent Number: 5,981,328
[45] Date of Patent: Nov. 9, 1999

[54] METHOD OF FORMING A HIGH LOAD RESISTANCE TYPE STATIC RANDOM ACCESS MEMORY CELL

[75] Inventors: Gug Seon Choi; Ji Sung Kang; Jong Owan Nam, all of Kyoungkido, Rep. of Korea

[73] Assignee: Hyundai Electronics Industries Co., Ltd., Rep. of Korea

[21] Appl. No.: 08/854,489

[22] Filed: May 12, 1997

[30] Foreign Application Priority Data

May 13, 1996 [KR] Rep. of Korea ..................... 96-15821

[51] Int. Cl.⁶ ................. H01L 21/8234; H01L 21/8244; H01L 21/20
[52] U.S. Cl. ............................. 438/238; 438/384
[58] Field of Search ..................... 438/207, 206, 438/220, 307, 322, 478, 491, 384, 385, 238

[56] References Cited

U.S. PATENT DOCUMENTS

| | | | |
|---|---|---|---|
| 5,012,443 | 4/1991 | Ema | 365/51 |
| 5,034,797 | 7/1991 | Yamanaka et al. | 257/380 |
| 5,093,706 | 3/1992 | Mitsuhashi et al. | 357/41 |
| 5,668,380 | 9/1997 | Wuu et al. | 257/66 |
| 5,805,497 | 9/1998 | Uchida | 365/156 |
| 5,844,838 | 12/1998 | Roberts | 365/174 |

*Primary Examiner*—Brian Dutton
*Attorney, Agent, or Firm*—Blakely Sokoloff Taylor & Zafman

[57] ABSTRACT

The present invention is related to a high load resistance (HLR) type static random access memory (SRAM) which is small enough to have a profit in device integration. The present invention also provides an SRAM cell, which is easy to convert the thin film transistor (TFT) type SRAM cell into the HLR type SRAM as occasion calls. A high load resistance type static random access memory cell according to the present invention has four polysilicon layers and two metal lines, this is similar to a conventional TFT type SRAM cell. One layer of the four polysilicon layers is used for a high load resistance element and a power line according to the amount of the impurity implanted in the polysilicon layer.

3 Claims, 4 Drawing Sheets

5,981,328

METHOD OF FORMING A HIGH LOAD RESISTANCE TYPE STATIC RANDOM ACCESS MEMORY CELL

BACKGROUND OF THE INVENTION

1. Field of the Invention

The present invention relates to a static random access memory (SRAM) cell and a method for forming the same, and more particularly to a high load resistance (HLR) type SRAM cell.

2. Description of the Prior Art

As shown in FIG. 1, an SRAM cell includes six elements, a pair of driver transistors M1 and M2, a pair of load elements 10 and 10', and a pair of access transistors M3 and M4. The driver transistors M1 and M2 have the gates and drain electrodes cross-coupled, and the load elements 10 and 10' are connected to the drain electrodes of the driver transistors M1 and M2. Also, the access transistors M3 and M4 are connected to the drain electrodes of the driver transistors M1 and M2. The access transistors are controlled by the word line and connect the cell node to the bit line in order to control the access path of the cell.

The SRAM cell is classified into two classes by the type of the load elements, one of which is the thin film transistor (TFT) type SRAM cell and the other is the high load resistance (HLR) type SRAM cell. Typically, the TFT type SRAM cell has low power dissipation and is more profitable than the HLR type in the device integration. However, the manufacturing process of the TFT type SRAM cell is more complicated. Also, the TFT type SRAM cell has problems such as a low repeatability and a degradation of electrical characteristics in testing the reliability of the device. Therefore, a TFT type SRAM cell is used only for a low speed SRAM cell, and the HLR type SRAM cell, which is less restricted in the power dissipation, is used for a high speed SRAM cell.

The conventional HLR type SRAM cell has two polysilicon layers and two metal layers. That is, the gate of the driver transistor and the ground line are formed with a first conductivity layer, and the high load resistance and the power line are formed with a second conductivity layer.

However, in case the gate of the driver transistor and the ground line are formed with the same conductivity layer, the space between the gate of the driver transistor and the ground line must meet the design rule. For example, the space must be more than 0.6 ∞m for a 4M SRAM. Therefore, the size of the cell may increase according to the space between the gate of the driver transistor and the ground line.

Moreover, it is not easy to convert a TFT type SRAM cell into a HLR type SRAM cell.

SUMMARY OF THE INVENTION

Therefore, the present invention has been made in view of the above mentioned problems, and an object of the present invention is to provide a HLR type SRAM cell, which is small enough to have a profit in the device integration, and a method for fabricating the same.

Another object of the present invention is to provide a HLR type SRAM cell, capable of being fabricated using a mask process to which a TFT type SRAM cell pertains and a method for fabricating the same.

In accordance with the present invention, there is disclosed a high load resistance type static random access memory cell comprising: underlayers formed over a predetermined region of the semiconductor substrate, said underlayers comprise a first conductivity layer to form the gates of the two driver transistors and two access transistors, and a second conductivity layer to form the ground lines connected to said driver transistors; a first insulating layer formed on said underlayers, having openings exposing predetermined reions of said underlayers; a third conductivity layer formed on said first insulating layer to form the contact pads, being contacted to said driver and access transistors through said openings; a second insulating layer formed on said third conductivity layer and said first insulating layer; and a fourth conductivity layer formed on said second insulating layer, wherein said fourth conductivity layer is made of a polysilicon layer and said polysilicon layer including: a highly doped layer to be used as a power source line; and an undoped or lightly doped layer to be used as a high load resistance element.

Also, in another aspect of the present invention, there is disclosed a method of forming a high load resistance type static random access memory cell including the steps: forming underlayers on a predetermined region of a semiconductor substrate, wherein said underlayers comprise a first polysilicon layer to form the gates of the two driver transistors and two access transistors, and a second polysilicon layer to form the ground lines to be connected to said driver transistors; forming a first insulating layer on said underlayer to isolate the upper conductivity layers from lower conductivity layers; selectively etching said first insulating layer to expose a predetermined region of said underlayers; depositing a third polysilicon layer over said first insulating layer; patterning said third polysilicon layer to form the contact pad to be contacted to said driver and access transistors; forming a second insulating layer over said third conductivity layer to isolate the upper and lower conductivity layers; depositing a fourth polysilicon layer on said second insulating layer; selectively implanting impurity into said fourth polysilicon layer so that a highly doped layer and an undoped or highly doped layer are formed; and patterning said fourth polysilicon layer, whereby the highly doped layer to be used as a power source line and an undoped or lightly doped layer used as a high load resistance element.

BRIEF DESCRIPTION OF THE DRAWINGS

These and other objects, features and advantages of the present invention will more fully apparent from the description of the preferred embodiments with reference to the accompanying drawings, in which.

DETAILED DESCRIPTION OF THE PREFERRED EMBODIMENTS

A detailed description of the embodiment according to the present invention will be given below with reference to accompanying drawings.

A HLR type SRAM cell, according to present invention, is formed by modifying the layout of the polysilicon layer of the gate of the TFT and controlling the ion implantation condition of the channel region of the polysilicon layer of the TFT. For example, in the bottom gate type TFT, a region of high load resistance is formed by implanting ions into the channel and the offset region of the channel polysilicon, after removing the gate polysilicon beneath the channel of the TFT.

A HLR type SRAM, according to the present invention, is easily formed by changing the layout of the conventional TFT type SRAM cell. The size of the HLR type SRAM cell, according to the present invention, is reduced by 30% when compared with a conventional HLR type SRAM including two polysilicon layers and two metal layers.

First, a further description of the structure of a conventional TFT type SRAM cell will be given below comparing it with a HLR type SRAM cell according to the present invention. The structure shown in FIG. 2 has a substructure including two conductivity layers, first and second polysilicon layers, for the driver transistors and the power lines, and an insulation layer for isolating the upper conducting layers from the lower conductivity layers. This substructure is very common to those skilled in the art, so a further description of the substructure is omitted.

A third polysilicon layer 2 serves not only as the gate of the TFT but also as a contact pad connected to the drain of the transistor. A fourth polysilicon layer 3 is divided into a drain region, a source region, a channel region and a power line, according to the sorts and the amount of the impurities. Here, the channel of TFT is a load element.

Figure 2:
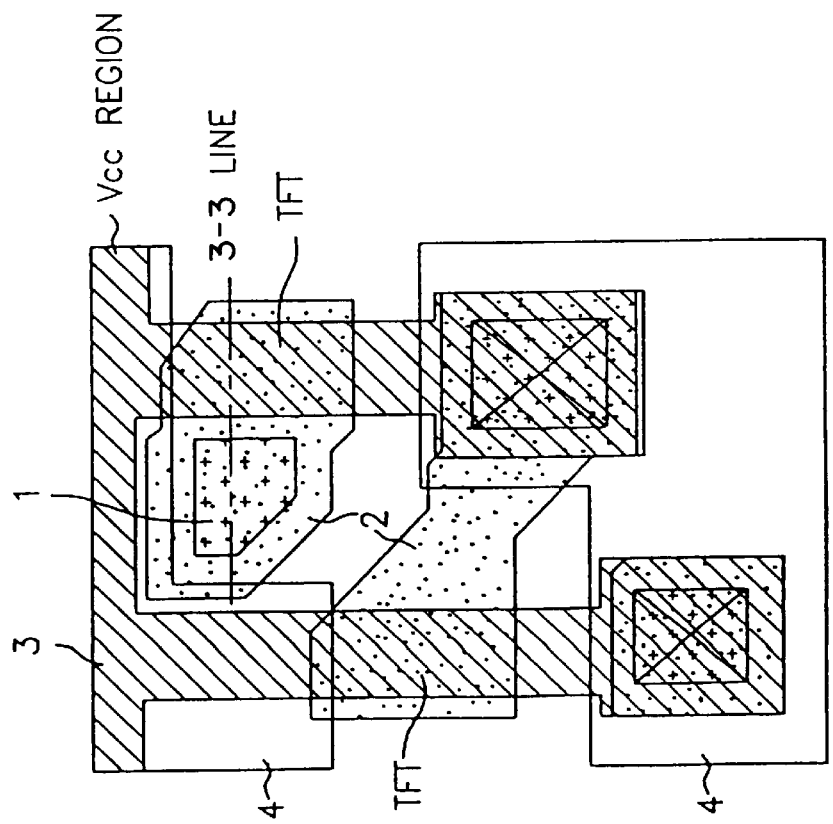
FIG. 2 is a layout of the conventional TFT type SRAM cell.
Figure 3:
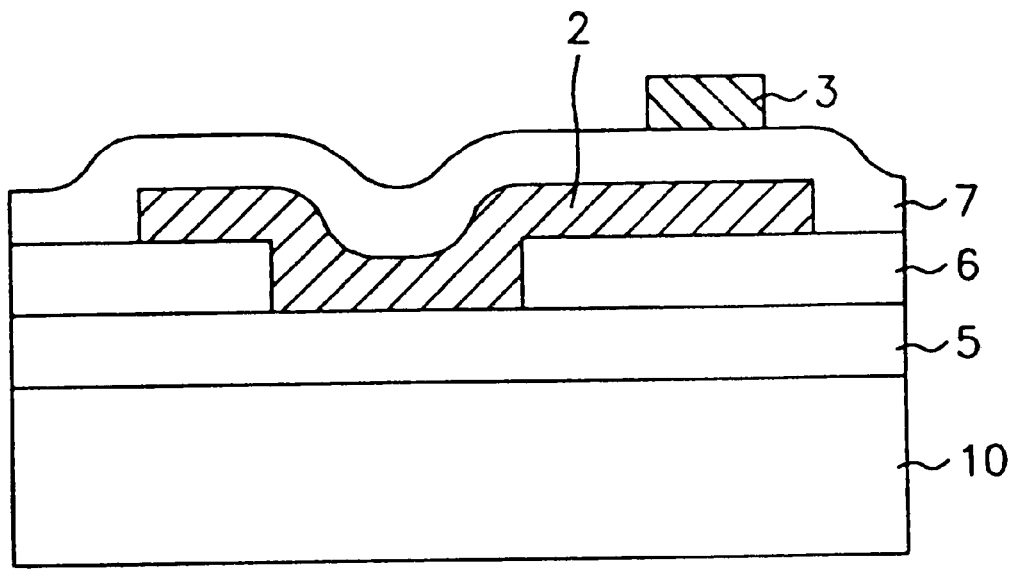
FIG. 3 is a cross sectional view of the region taken along the line 3—3 of FIG. 2.

The FIG. 3 is a cross sectional view of the region taken along the line 3—3 of FIG. 2. The reference mark 10 is a semiconductor substrate, 5 is an underlayer, 6 and 7 are insulating layers, 2 is a third polysilicon layer and 3 is fourth polysilicon layer.

Figure 1:
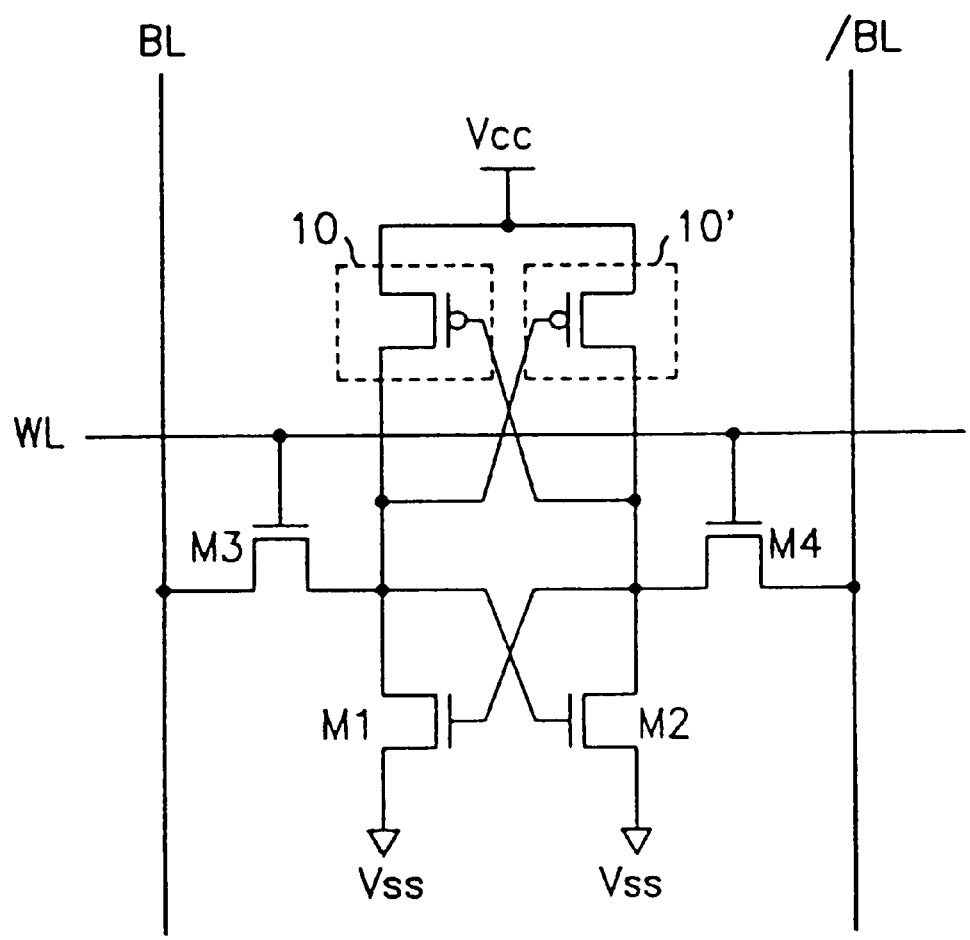
FIG. 1 is a conventional circuit of an SRAM cell.
Figure 4:
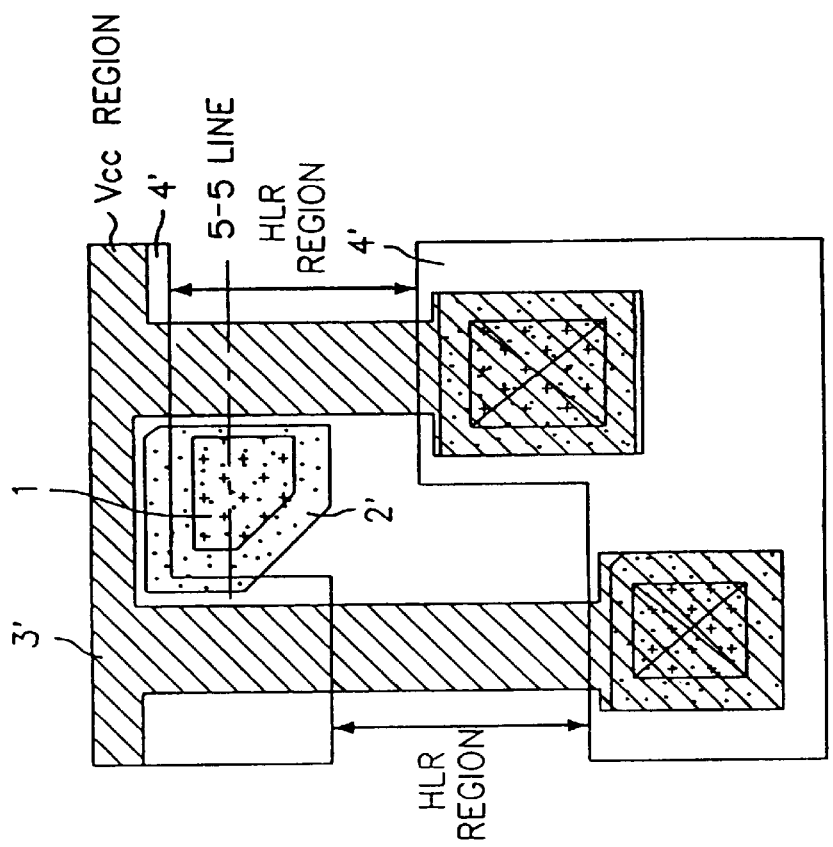
FIG. 4 is a layout of the HLR type SRAM cell according to the present invention.

FIG. 4 is a layout of the high load resistance and the power line of a HLR type SRAM cell according to the present invention. The structure shown in FIG. 4 has a substructure including an underlayer composed of first and second polysilicon layers, which are the conductivity layers for forming the driver transistors and the power lines, and an insulating layer to isolate the upper conducting layer from the lower conductivity layer. The substructure is also very common to those skilled in the art, so a further description of the substructure is omitted.

The structure of a HLR type SRAM cell, according to the present invention, is similar to the structure used in the conventional TFT type SRAM cell processing technology. In the present invention, the gate electrode of the conventional TFT is not formed and the channel polysilicon layer used in forming the conventional TFT load element is used as a load line. AS shown in the FIG. 4, the structure of the HLR type SRAM cell, according to the present invention, includes a third polysilicon layer 2' which is connected to the drain of the driver transistor through the contact hole. The third polysilicon layer 2' functions only as a contact pad, which connects the upper and lower conductivity layers, so it is different from the third polysilicon layer, denoted as "2" in FIG. 2 and FIG. 3, of the above mentioned conventional TFT type SRAM cell. Therefore, the third polysilicon layer 2' can not be overlapped with an upper fourth polysilicon layer 3'. Moreover, the fourth polysilicon layer 3' is not used for the channel region or the source/drain regions of the TFT, it is different from the fourth polysilicon layer, denoted as "3" in FIG. 2 and FIG. 3, of the conventional TFT type SRAM cell.

Therefore, there is no need to form an offset region or source/drain regions, so that the reliability and the repeatability of the device may be improved. In a HLR type SRAM cell of the present invention the power line and the load resistance element are formed by carrying out the ion implantation process which implants impurity ions into a region 4'. Accordingly, the ion-implanted polysilicon layer 3' is used as a metal layer such as the power line. On the other hand, the fourth polysilicon layer 3' outside the region 4' is used as the resistance element. That is, the fourth silicon layer 3' is parted by the concentration of the impurity. such that the heavily doped region is the power line and undoped region is the high load resistance element. Also the resistivity of the load element is can be controlled by lightly implanting impurity ions into the polysilicon layer 3'.

According to the present invention, at least 4 conductivity layers are formed before the metalization process for wiring, reducing the size of the HLR type SRAM cell by 30% compared to a conventional HLR type SRAM cell, in which only 2 conductivity layers are formed before the metalization process. Therefore, the devices integration is improved.

Referring to FIG. 4 and FIGS. SA to 5C, a method for fabricating the HLR type SRAM cell according to the present invention will be given below.

Figure 5A:
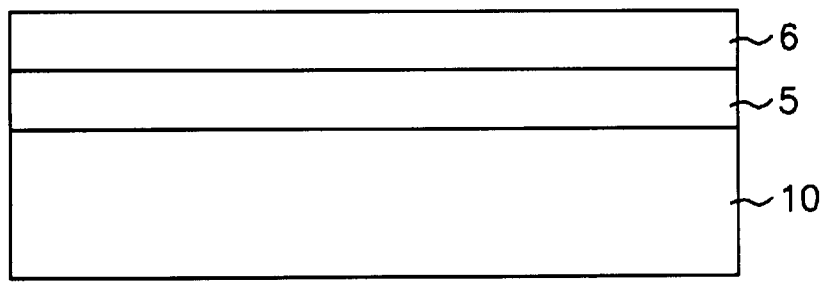
FIG. 5A to 5C are cross sectional views of a region taken along the line 5—5 in FIG. 4.

First, referring to FIG. 5A, an insulating layer 6 for isolating the upper conducting layer from the lower conductivity layer are formed over an underlayer 5. The underlayer 5 formed on a predetermined region of the semiconductor substrate 10, contains a first polysilicon layer for the gate of the driver transistor and a second polysilicon layer for the ground line. The underlayer 5 is formed by the method for fabricating a conventional TFT type SRAM cell, and this method is very common to those skilled in the art, therefore a further description of the method is omitted.

Figure 5B:
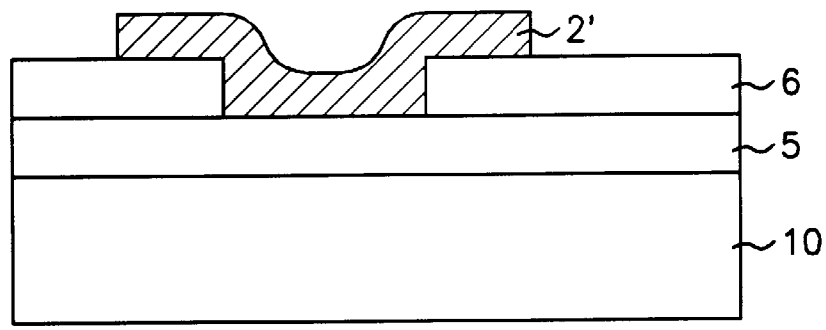

Referring next to FIG. 5B, the insulating layer 6 is selectively etched to form a contact hole, exposing the drain (not shown) of the driver transistor, and thereafter, the third polysilicon layer 2' is deposited and patterned, filling the contact hole. As mentioned above, different from the third polysilicon layer of a conventional TFT type SRAM cell, the pattern of the third polysilicon 2' functions only as the contact pad to electrically connect the upper conducting layer to lower conductivity layer, and therefore, the third polysilicon layer 2' can not be overlapped with the fourth polysilicon layer 3' to be formed above it as compared with the third polysilicon layer 2 in FIG. 3.

Figure 5C:
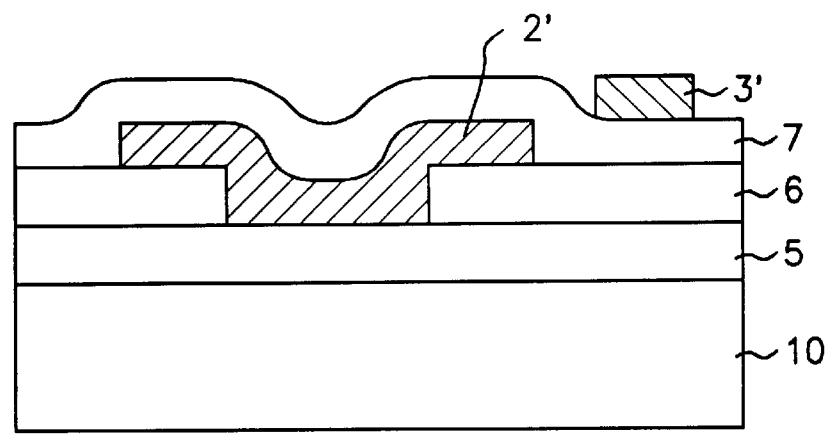

Referring next to FIG. 5C, the insulating layer 7 is formed on the resulting structure and the fourth polysilicon layer 3' is deposited on the insulating layer 7 to form the power line and the high load resistance element. Thereafter, the polysilicon layer 3' is patterned after it is selectively ion-doped in accordance with the ion implantation region set fourth in FIG. 4. The polysilicon is an insulator and its resistivity varies with the amount of the implanted impurity. Therefore, the amount of the impurity, which is implanted into the region corresponding to the power line, is much more than the amount of the impurity, which is implanted into the region corresponding to the high load resistance. Otherwise, the impurity implantation can be also performed only in the region of the power line.

Hereafter, the insulating layer for isolating the upper conducting layer from the lower conductivity layer, the metal wrings and the insulating layer for passivation are formed in a same manner as the method for forming the conventional TFT type SRAM cell has used.

The present invention provides a reduced HLR type SRAM cell, which is formed by changing the circuit layout of the TFT type SRAM cell, and therefore, high and low speed SRAMs are selectively formed by easily changing the circuit layout.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method of forming a high load resistance type static random access memory (SRAM) cell comprising the steps of:

forming underlayers on a region of a semiconductor substrate, wherein said underlayers include a first polysilicon layer for gates of driver and access transistors, and a second polysilicon layer for ground lines connected to said driver transistors, thereby forming a resulting structure;

forming a first insulating layer on said resulting structure;

selectively etching said first insulating layer and forming an opening to expose a region of said resulting structure;

depositing a third polysilicon layer over said first insulating layer and the exposed region of said resulting structure;

patterning said third polysilicon layer to form a contact pad to be contacted to said driver and access transistors through said opening;

forming a second insulating layer over said third polysilicon layer;

depositing a fourth polysilicon layer on said second insulating layer;

selectively implanting impurity ions into said fourth polysilicon layer so that said fourth polysilicon layer is divided into first and second regions according an amount of said impurity ions; and patterning said fourth polysilicon layer, such that said first region of said fourth polysilicon layer is used as a power source line and said second region of said fourth polysilicon layer is used as a high load resistance element.

2. A method of forming a high load resistance type SRAM cell according to claim 1, wherein said third and fourth polysilicon layers are not overlapped with each other.

3. A method of forming a high load resistance type SRAM cell according to claim 1, wherein said first region of said fourth polysilicon layer is a highly doped region and wherein said second region of said fourth polysilicon layer is a lightly doped region or an undoped region.

* * * * *

UNITED STATES PATENT AND TRADEMARK OFFICE
CERTIFICATE OF CORRECTION

PATENT NO. : 5,981,328
DATED : November 9, 1999
INVENTOR(S) : Choi et al.

It is certified that error appears in the above-identified patent and that said Letters Patent is hereby corrected as shown below:

In column 1, line 23, delete "the load elements ," and insert -- the load elements, --.

In column 1, line 45, delete "than 0.6 ∞m" and insert -- than 0.6 µm --.

In column 3, line 50, delete "AS shown" and insert -- As shown --.

In column 4, line 20, delete "FIGS. SA to 5C" and insert -- FIGS. 5A to 5C --.

In column 6, line 7, delete "according an" and insert -- according to an --.

Signed and Sealed this

Tenth Day of April, 2001

Attest:

NICHOLAS P. GODICI

*Attesting Officer*   *Acting Director of the United States Patent and Trademark Office*